(12) United States Patent
Takada et al.

(10) Patent No.: US 6,844,116 B2
(45) Date of Patent: Jan. 18, 2005

(54) TRANSFER SHEET FOR TRANSFERRING PROTECTIVE LAYER FOR PHOTOGRAPHIC EMULSION FACE AND PHOTOMASK WITH PROTECTIVE LAYER

(75) Inventors: Toshihiko Takada, Saitama (JP); Makoto Sakuma, Saitama (JP); Kazuo Nagashima, Saitama (JP); Tomonobu Omura, Tokyo (JP)

(73) Assignee: Nippon Paper Industries Co., LTD, Tokyo (JP)

( * ) Notice: Subject to any disclaimer, the term of this patent is extended or adjusted under 35 U.S.C. 154(b) by 190 days.

(21) Appl. No.: 10/048,397
(22) PCT Filed: Jun. 1, 2001
(86) PCT No.: PCT/JP01/04657
§ 371 (c)(1), (2), (4) Date: Jan. 30, 2002
(87) PCT Pub. No.: WO01/92957
PCT Pub. Date: Dec. 6, 2001

(65) Prior Publication Data
US 2003/0036004 A1 Feb. 20, 2003

(30) Foreign Application Priority Data
Jun. 1, 2000 (JP) .................................... 2000-165147
Jun. 1, 2000 (JP) .................................... 2000-165148

(51) Int. Cl.[7] ........................ G03F 9/00; G03C 1/492; G03C 1/76
(52) U.S. Cl. .................... 430/5; 430/271.1; 430/523
(58) Field of Search ................. 430/270.1, 271.1, 430/5, 281.1, 288.1, 523

(56) References Cited

U.S. PATENT DOCUMENTS 6,265,133 B1 * 7/2001 Takahashi et al. ....... 430/281.1

FOREIGN PATENT DOCUMENTS

| JP | 60-169849 A | 9/1985 |
| JP | 62-85254 A | 4/1987 |

* cited by examiner

Primary Examiner—Saleha R. Mohamedulla
(74) Attorney, Agent, or Firm—Millen, White, Zelano, Branigan, P.C.

(57) ABSTRACT

The present invention is an invention providing a photographic emulsion surface protective layer transfer sheet, characterized by having on one surface of a releasable support a photographic emulsion surface protective layer which is adhesive and in an uncured state, and characterized in that the photographic emulsion surface protective layer in an uncured state comprises an ionized radiation-curable resin composition containing a hydrophilic group-containing monofunctional (meth)acrylate and a polyfunctional (meth)acrylate. This transfer sheet can have an adhesive layer excellent in scratch resistance, close adhesion to an emulsion surface and solvent resistance. Therefore, when this transfer sheet is used particularly for forming a protective layer on the emulsion surface of a photomask, the photomask capable of long-term consistent use is obtained.

20 Claims, 1 Drawing Sheet

Layer structure of Transfer Sheet

- E : Separator
- D : Adhesive layer
- C : Cure layer
- B : Release layer
- A : Support Transfer Process Step (1)

- A : Adhesive layer
- B : Cure layer
- C : Release layer
- D : Support
- F : Photo mask Step (2) Exposure to UV-rays Step (3)

- A : Support
- B : Release layer

↑ Separation

- C : Cure layer
- D : Adhesive layer
- F : Photo mask

TRANSFER SHEET FOR TRANSFERRING PROTECTIVE LAYER FOR PHOTOGRAPHIC EMULSION FACE AND PHOTOMASK WITH PROTECTIVE LAYER

TECHNICAL FIELD

The present invention relates to a transfer sheet used for transferring a protective layer to an emulsion surface of a photomask used in patterning for a printed wiring board or a display panel or a photomask for photomechanical process, and a photomask having an emulsion surface protected by the protective layer.

BACKGROUND OF THE INVENTION

As methods of protecting the surfaces of a wide variety of materials, there have so far been known a method of bonding a protective sheet having an adhesive layer on one side of a thin film, such as a polyester film, to the surface of a subject to protect and a method of forming a protective layer on a film having releasability and transferring the protective layer to the surface of a subject to protect through the medium of a pressure sensitive adhesive or a general adhesive. The method of transferring a protective layer to the subject surface via a pressure sensitive adhesive or a general adhesive has an advantage that a thin protective layer can be formed, but it has also a disadvantage of failing to ensure sufficient strength in the transferred layer as a whole because the strength of the pressure sensitive adhesive or general adhesive layer is lower than that of the protective layer. In order to overcome this disadvantage, various studies have been hitherto made.

For instance, Japanese Patent Laid-Open Nos. Sho 64-18698 and Hei 4-201478 disclose the inventions in which the protective layer and the adhesive layer made up of an ionized radiation-curable resin which is a solid in an uncured state but has thermal plasticity is provided on the releasable surface of a release sheet. In addition, Japanese Patent Laid-Open No. Hei 7-125496 discloses the transfer sheet having on a base film having releasability a subbing layer and a non-adhesive semi-cured layer in a gelled state formed by irradiating a UV-curable resin coating with UV rays in an exposure dose about ⅓ to about ⅔ the exposure dose required for completely curing the resin coating.

However, since the layer brought into contact with a subject of protection has a non-adhesive surface, those transfer sheets have a defect that heating treatment at the time of bonding or additional application of a UV-curable resin to the subject surface is required for bonding the transfer layer to the subject surface and thereby the protective layer formation process becomes complicated. Further, such transfer layers have a drawback of being unfit for transfer to materials sensitive to heat or solvents (e.g., emulsion surfaces of photographic films utilized as photomasks).

In addition, Japanese Patent Laid-Open No. Sho 61-258742 proposes a method of transferring a protective layer having both releasability from a support and adhesion to the support to the surface of a subject to protect through no medium or the medium of a combination of hot-sealable and pressure sensitive adhesive layers. In this method also, heating is required at time of transfer. The use of a pressure sensitive adhesive layer with the intention of avoiding the necessity for heating caused a defect that the protected layer formed was poor in surface strength.

On the other hand, a photomask is generally made up of a transparent substrate and an emulsion layer provided thereon, and it is a sheet wherein patterns formed by a CAD system or the like are reproduced by subjecting the sheet sequentially to an exposure with a device like a photoplotter, development such as washing, fixation and drying. The photomask in which the desired patterns are formed is often used as an original in the so-called photoetching process. More specifically, a photopolymer-containing layer is exposed via the photomask in a state that the photomask is kept in close contact with the layer or superimposed on the layer with a slight gap between them, then developed, and further dried. Thus, patterns corresponding to the patterns in the photomask are formed in the photopolymer-containing layer.

Incidentally, the emulsion layer used for a photomask contains gelatin as a main component, and the pencil hardness thereof is 2B or below. Therefore, when the contact exposure in a photoetching process is carried out in a condition that the emulsion layer surface is brought into close contact with the photopolymer layer as a subject without providing any special protective layer, the photomask tends to receive flaws on the surface to result in a partial loss of its pattern data. Further, the emulsion layer surface is contaminated with microbes to cause a loss of information on the photomask or defective shooting.

Under these circumstances, the aforementioned defects have so far been compensated for by bonding a commercial pressure sensitive adhesive-applied film to the emulsion surface of an unprotected photomask (the term "an unprotected photomask" as used herein means a photomask which is provided with no protective layer or the like but has an emulsion layer surface in a bare state). However, such a pressure sensitive adhesive-applied film has a drawback of being sensitive to scratches of hard foreign materials because the layer of the pressure sensitive adhesive is soft and the film itself tends to suffer scratches. Therefore, increase in the number of times such a photomask has been used necessitates replacing the protective layer of the photomask by a new one. Therefore, it cannot be said that commercial pressure sensitive adhesive-applied films function satisfactorily as protective layers.

When the pressure sensitive adhesive-applied films are increased in film thickness for diminishing the foregoing drawback, the protective layer strength is heightened, but the UV-ray transmittance as a photomask's optical characteristic is lowered. As a result, it becomes necessary to extend the exposure time, and what is worse, high-definition patterning becomes impossible because reflection, refraction and scattering of light reveal their influences. In other words, in the case of using pressure sensitive adhesive-applied films, the photomask's drawback of being sensitive to flaws cannot be overcome by adjustment of film thickness since the film thickness decreased to an extent that no problems are caused in the foregoing aspect of optical characteristics cannot secure the strength as the protective layer (the order of B in pencil hardness). In addition, such thin films tend to become wrinkled at the time when they are bonded to unprotected photomasks, so they cause lowering of workability. Accordingly, the pressure sensitive adhesive-applied films can hardly satisfy all the requirements, sufficient protective layer strength, satisfactory UV-ray transmittance and good workability.

Furthermore, as described in Japanese Patent Laid-Open No. Hei 11-305420, it has been tried to provide protective layers by applying coating materials on unprotected photomasks according to a variety of methods, such as spray coating, spin coating and dip coating methods, and then thermally curing them simultaneously with drying.

However, such methods require a heat-applied aging time of 18 to 72 hours, so there is the fear of a damage to the emulsion surfaces. In addition, it is hard to control the coating layer thickness in the foregoing coating processes (wet processes), so it has been difficult to put such methods to practical use.

Therefore, a first object of the present invention is to provide a transfer sheet which enables easy formation of a protective layer having good contact with an emulsion layer and high resistance to scratching, even when the emulsion surface is poor in heat resistance and solvent resistance.

A second object of the present invention is to provide a protective layer-attached photomask having excellent optical characteristics and high resistance to scratching.

DISCLOSURE OF THE INVENTION

The inventors have found that a transfer sheet having excellent transfer workability can be obtained by providing a specially designed adhesive uncured layer for photographic emulsion surface protection use (this layer is referred to as "an adhesive layer" hereinafter) on one side of a support. More specifically, an embodiment of the invention is a transfer sheet for forming a photographic emulsion surface protective layer, with the transfer sheet having an adhesive layer containing at least an ionized radiation-curable resin composition on a support surface having releasability, wherein the ionized radiation-curable resin composition comprises a hydrophilic group-containing monofunctional (meth)acrylate and a polyfunctional (meth)acrylate. Another embodiment of the invention is a method of forming a photographic emulsion surface protective layer by use of the aforesaid transfer sheet. Still another embodiment of the invention is a photomask having a protective layer formed by using the foregoing method. In these embodiments, a cure layer may be present between the support and the adhesive layer.

In particular, further incorporation of a thermosetting resin and/or polyamine into the adhesive layer of the present transfer sheet makes adhesion control easy and has an advantage in that the protective layer formed can have high adhesion to the emulsion surface of a photomask and high strength. The thus obtained protective layer-attached photomask bear comparison with the protective layer-free photomask in point of optical characteristics, and besides, it is remarkably improved in resistance to scratching.

BEST MODE FOR CARRYING OUT THE INVENTION

Figure 1:
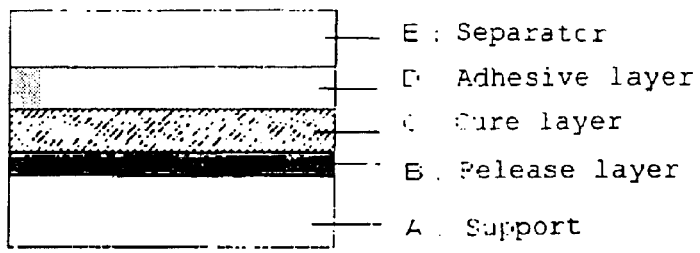
FIG. 1 is a structural view showing an embodiment of the present transfer sheet.
Figure 2:
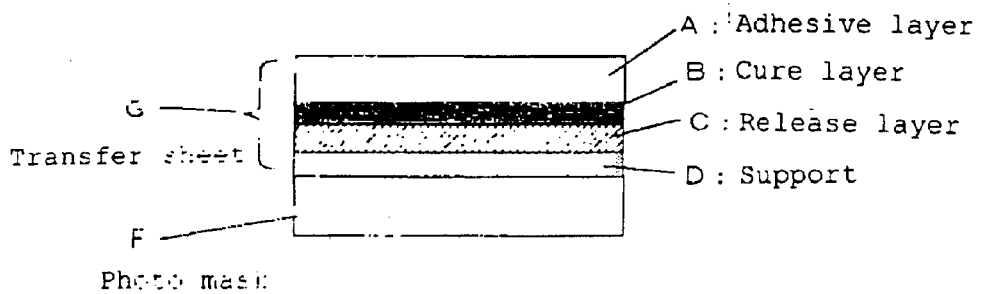
FIG. 2 is a schematic diagram showing an embodiment of the transfer process for providing a protective layer on a photomask by use of the present transfer sheet.
Figure 2:
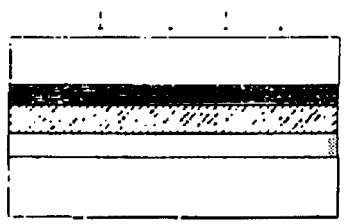
Figure 2:
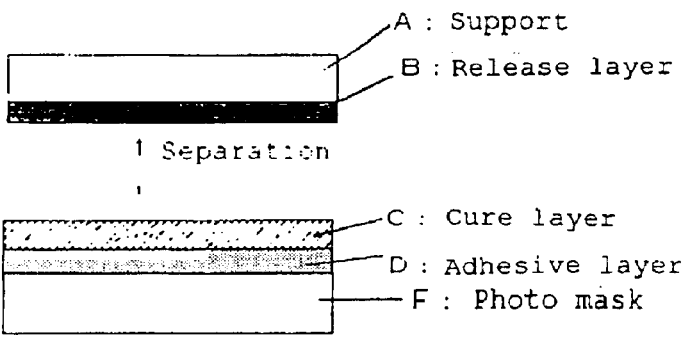

The present invention is described below in detail.

The support having releasability which is used for the present transfer sheet can be selected appropriately from known materials as far as the materials are releasable from an adhesive layer or a cure layer provided thereon. Examples of a support especially suitable for the present transfer sheet include plastic films containing as a main component polyethylene terephthalate, polypropylene, polyvinyl chloride, polystyrene, polycarbonate, or triacetate. The support used has no particular restriction as to the thickness, but the thickness ranging from about 20 $\mu$m to about 150 $\mu$m is advantageous in that wrinkles and bubbles are hardly formed at the time of transfer to a subject of protection, so good workability can be obtained.

In the invention, a release agent-treated substrate prepared by treating a sheet-form substrate with a release agent may also be used as the support for the purpose of effecting easy transfer of an adhesive layer. As examples of such a release agent-treated substrate, mention may be made of not only commercially available release films provided with coatings of silicone, Teflon or the like, but also sheet-form substrates having thereon release layers which are each formed by coating a coating composition containing urethane resin, melamine resin, fluorocarbon resin, silicone resin, polyester resin, polyolefin resin or a mixture thereof so as to have a dry thickness of 0.1 to 5 $\mu$m, preferably 1 to 2 $\mu$m, and then drying the composition coated.

When the release layer is rendered matte by adding a pigment thereto, the matte pattern is formed on an adhesive layer provided thereon, or a cure layer provided thereon when required; as a result, it becomes possible to lay a protective layer having a matte outermost layer on a subject to protect. In other words, the outermost layer of the protective layer transferred from the present transfer sheet can have the same surface profile as that of the release surface of the transfer sheet support. When the release surface of the support is smooth, the outermost surface of the protective layer transferred becomes clear; while, when the release surface is matte, the outermost surface of the protective layer transferred becomes matte. The matte release layer can be obtained with ease by adding the foregoing filler in an amount of at least 0.5 parts by weight to 100 parts by weight of resin.

Even when the outermost layer is rendered matte, no pigment is present inside the protective layer. As a result, the protective layer causes no scattering of light in its interior, and so it makes it possible to reproduce fine patterns and can used to advantage as the protective layer of a photomask. In the case of forming patterns in a photoresist on a printed wiring board, for instance, a photomask is brought into sufficiently close contact with the surface of the photoresist on a printed wiring board under a reduced pressure, and then subjected to exposure. In this case, the air in the gap between the photomask and the photoresist can be evacuated smoothly on condition that the protective layer of the photomask is made matte, so air bubbles remaining between them can be prevented from evolving. The remaining air bubbles become causes of refraction, reflection and scattering of light upon exposure for patterning and interfere with reproduction of patterns.

In the case of performing exposures in a condition that a slight distance is kept between a photomask and a subject (a light-sensitive material), or the so-called proximity exposures, it is appropriate that the photomask surface on the side of the light-sensitive material be smooth. This is because a rough photomask surface causes a problem that ultraviolet rays used for exposure refract on the photomask surface to make the light-sensitive material surface uneven. When the present photomask is used for patterning with a precision of a pattern width of 50 $\mu$m or below by performing proximity exposures in particular, it is desirable that the surface roughness of the support be $5.0 \times 10^{-2}$ $\mu$m or below in terms of ten-point mean roughness with respect to a reference length of 0.8 mm defined in JIS-B-0601. When the surface roughness is greater than $5.0 \times 10^{-2}$ $\mu$m, asperities are developed on the dry film patterns (sensitive material surface) after exposure to cause problems.

In the invention, the adhesive layer is cured by irradiation with ionized radiation before release of the support. Therefore, it is desirable for the support to have a high ionized-radiation transmittance. Specifically, the suitable ionized-radiation transmittance of the support is at least 50%, preferably at least 80%.

In order that the present protective layer after curing can have sufficient resistance to scratching, satisfactory solvent-proofing properties and close adhesion to a photographic emulsion surface, it is appropriate that the uncured protective layer for photographic emulsion surface protection use have a curing index (I) represented by the following equation in the range of 80 to 300, preferably 110 to 300:

$$I = R1 \times S1 + R2 \times S2 + \ldots + Rn \times Sn$$

wherein I is a curing index; $R1, R2, \ldots, Rn$ are percentages by weight of resin components (resin 1, resin 2, ..., resin n), respectively, in the uncured protective layer; and $S1, S2, \ldots, Sn$ are acryloyl group numbers of resin components (resin 1, resin 2, ..., resin n), respectively, in the uncured protective layer.

The term "ionized radiation" as used in the invention is intended to include electromagnetic waves of any kinds as far as they have capabilities of causing ionization in materials. However, industrially utilizable electromagnetic waves are ultraviolet rays and electron beams. Additionally, γ-rays and the like are also usable. From the practical point of view, ultraviolet rays are preferred, and the suitable sources therefor include a high-pressure mercury lamp, an ultrahigh-pressure mercury lamp, a metal halide lamp and so on.

The term "an ionized radiation curable resin composition" as used in the invention means a composition which can be cured by irradiation with ionized radiation. In the composition are specifically used oligomers and/or monomers containing acryloyl or methacryloyl groups as functional groups, such as acrylates, methacrylates and so on. More specifically, urethane (meth)acrylate, polyester (meth)acrylate, epoxy (meth)acrylate, (meth)acrylates of silicone type and the like are used in the form of oligomer and/or monomer.

In the invention, a hydrophilic group-containing monofunctional (meth)acrylate monomer is selected from those resins, and incorporated as an essential component in an ionized radiation curable resin composition together with a polyfunctional (meth)acrylate described hereinafter. By incorporation of a hydrophilic group-containing monofunctional (meth)acrylate monomer, elasticity can be imparted to the protective layer and markedly improved contact with the photomask emulsion surface can be achieved. In addition, the hydrophilic group contained in the monomer produces an effect of lowering surface resistance of the protective layer, so anti-static properties are also imparted thereby. The photomask surface prevented from being electrified offers an advantage in that adhesion of foreign substances, such as dust and the like, is prevented. It is appropriate that the hydrophilic group-containing monofunctional (meth)acrylate be contained in a proportion of 20 to 55 weight %, particularly 25 to 50 weight %, on a solids basis in an adhesive uncured protective layer.

Polyfunctional (meth)acrylates in the ionized radiation curable resin composition act so as to heighten the surface strength of the protective layer and impart solvent-proof properties to the protective layer. However, when the polyfunctional (meth)acrylate resin used has a high viscosity, the compliance of the adhesive layer with stepped patterns on the photomask emulsion surface becomes poor. As a result, air bubbles tend to be trapped in the bonded region. From the viewpoint of preventing contamination with air bubbles, it is desirable to select low-viscosity polyfunctional (meth)acrylate resins, specifically resins having a viscosity of 1,000 (cps at 25° C.) or below as measured with a Brookfield type viscometer.

In general the ionized radiation curable resins have fluidity in an uncured state, and so they suffer a problem of having a tendency to be squeezed out of the edges of a transfer sheet when the transfer sheet is wound up. In the invention, therefore, it is preferable to adjust the hardness of the adhesive layer to the values required by mixing an appropriate amount of at least one thermosetting or heat-reactive resin with the present ionized radiation curable resins, and thermally curing the resulting composition. Further, the adhesive layer can have stickiness on such a level as to enable tentative adhesion to a substrate by addition of such a thermosetting resin.

The thermosetting resins usable in the invention are resins capable of being cured by heating, with examples including urea resin, melamine resin, phenol resin, epoxy resin, alkyd resin, urethane resin and the like.

Instead of these resins or together with these resins, at least one resin capable of reacting with ionized radiation curable resins under heating can be used in the invention. The use of such a reactive resin is beneficial, because it can increase the strength of the adhesive layer after curing.

Of the resins capable of reacting with ionized radiation curable resins under heating, the resins most suitably used in the invention are resins capable of being cured by addition reaction of active hydrogen atoms (e.g., hydrogen atoms of active amines) to acrylic unsaturated bonds. As examples of these resins, mention may be made of polyamines containing primary or secondary amino groups. Addition of at least one polyamine selected from polyamines containing primary or secondary amino groups to ionized radiation curable resins having acrylic unsaturated bonds (to which monomers or oligomers may be added) causes Michael addition reaction to yield stickiness. From the viewpoint of stickiness adjustment, it is advantageous in particular that the foregoing polyamines are acrylic graft copolymers which each have an acrylic trunk chain and acrylamide side chains (comb polymers). These acrylic graft copolymers are also effective for prevention of electrification.

The aforementioned thermosetting resins and resins capable of reacting with ionized radiation curable resins may be used independently of each other or in various combinations thereof.

In the invention, it is preferable in point of cost that the thermosetting resins or the ionized radiation curable resins be cured by heat for drying the coating composition coated for forming an adhesive layer. Therefore, it is undesirable to use resins having reaction temperatures higher than the softening point of a support, so it is appropriate that the resins commencing the reaction at temperatures of about 60° C. to about 130° C. be selected.

In the invention, the adhesive layer has stickiness, so a separator can be provided, if needed. In forming the present transfer sheet into winding products, it is beneficial in point of working efficiency to subject the support to release treatment on the side opposite to the adhesive layer-provided side, or to laminate a release-treated film (separator) on the adhesive layer after drying.

Examples of a separator which can be used therein include films of plastics, such as polyethylene terephthalate, polyethylene, polypropylene and the like, and paper or like sheets coated with a release agent, such as a silicone or the like. The separators 4 to 200 μm in thickness can be used, but from the viewpoint of workability it is appropriate that their thicknesses be from 12 to 50 μm. Of course, such a separator is removed at the time when the present transfer sheet is bonded to a subject of protection.

In using the present transfer sheet, the adhesive layer is bonded to the emulsion surface, and then irradiated with ionized radiation via the support or after removal of the support therefrom. In the case of faithfully copying the surface profile of the support to the protective layer, the irradiation via the support is preferred. The adhesive layer is cured by irradiation with ionized radiation to get sufficient adhesion to the emulsion surface. The irradiation dose required for complete adhesion of the adhesive layer to the surface of a photographic emulsion as a subject can be adjusted properly depending on the type of a photopolymerization initiator used, the resin composition used for the adhesive layer, and so on. Specifically, the suitable irradiation dose is from 30 to 1,000 mJ. Preferably, it is not lower than 100 mJ in the case where the ease of storage and handling are concerned; while it is not higher than 500 mJ from the viewpoint of reduction in curing time.

In the invention, the layer transferred to a subject may be constituted of two or more layers. The transfer layer is required to have two characteristics, (1) development of hardness and (2) adhesion to a subject. Basically, the former characteristic is a requirement for all the constituent layers, and the latter is a requirement for the surface brought into contact with the subject. In general, an increase in adhesion strength of a transfer layer to a subject causes a decrease in hardness of the transfer layer. When the conditions incompatible with each other need to be satisfied, it is required that the transfer layer be constituted of two optimized layers. With respect to the transfer layer constituted of at least two layers as mentioned above, the cure layer becomes the outermost layer after transfer, so the adhesion to a subject may receive no consideration. On the other hand, it is required to design the layer on the side brought into contact with a subject (the adhesive layer) in consideration of adhesion to a substrate. As resins used in the cure layer, resins similar in type to the resins used in the adhesive layer are preferred, because close adhesion between these layers can be attained.

When the adhesive layer is provided after forming a cure layer on a support in the invention, it is preferable to cure the cure layer before providing the adhesive layer, because the coating suitability of the adhesive layer can be enhanced.

When the total thickness of the layers transferred to a subject is too thick, there is the fear of cracking at the time of transfer; while, when the total thickness is too thin, the cure layer cannot perform its function. Therefore, the suitable total thickness of layers transferred is from 1 to 15 μm, particularly from 1 to 8 μm. When the transfer layer is constituted of the cure layer and the adhesive layer, the suitable thickness of the cure layer is from 1 to 5 μm and that of the adhesive layer is from 3 to 10 μm.

Although a pigment, such as silica, colloidal silica, mica, titanium dioxide, alumina, calcium carbonate, aluminum hydroxide or the like, can be added to the adhesive layer, the pigment added becomes a cause of light scattering. As a result, the use of a pigment in a large amount makes it impossible to keep optical characteristics of the photomask in a satisfactory condition. Therefore, it is required to control the amount of a pigment added to 5 parts by weight or below per 100 parts by weight of the foregoing resins, and it is preferable for the adhesive layer to be free of pigments.

The cure layer and the adhesive layer of the present transfer sheet can contain additives, such as a polymerization initiator, a leveling agent, an antiseptic, a coloring agent, an ultraviolet absorbent, an antioxidant, a plasticizer and so on, in such amounts as not to impair the present effects.

In addition, the release layer, the cure layer and the adhesive layer to constitute the present transfer sheet can be formed as appropriate by use of a coating machine selected properly from known coaters including a bar coater, a roll coater, a kiss coater, a curtain coater, a die coater, a blade coater, a comma coater and so on. In this case, the coating compositions coated on the support are each dried with a known dryer, such as an air floating dryer or an infrared dryer.

In providing the cure layer, the adhesive layer and the release layer for the support in the invention, it is a matter of course that such a plurality of layers may be provided by use of a single piece of continuous coating equipment (including a drying unit also).

In transferring the present transfer sheet to a subject surface (emulsion surface), the sheet is tentatively bonded to the subject surface by adhesion of the adhesive layer, and then completely bonded thereto by irradiation with ionized radiation. Accordingly, the transfer operation can be easily performed without heating or application of a solvent or so on. Further, since each of the curing and adhesive layers contains both hydrophilic group-containing monofunctional (meth)acrylate and low-viscosity ionized radiation curable resin made up of polyfunctional (meth)acrylate units, the present transfer sheet can provide a protective layer excellent in resistance to scratching, close adhesion to the emulsion surface and solvent-proof properties.

In particular, the present transfer sheet is effective in providing a protective layer for protecting the emulsion surface of a photomask. Further, the photomask provided with the present protective layer by the use of the present transfer sheet can be used consistently for a long time, because the protective layer provided has not only excellent optical characteristics (reduced refraction and reflection of light from the interface surface) but also high resistance to scratching and close adhesion to the emulsion surface.

EXAMPLES

In order to illustrate the present invention in more detail, the following examples are presented. However, the invention should not be construed as being limited to these examples. Additionally, all "parts" in Examples are by weight.

Example 1

(1) Preparation of Support:

On one side of a biaxially stretched 50 μm-thick polyethylene terephthalate (abbreviated as "PET" hereinafter) film, the following release layer forming solution was coated by means of a roll coater, and dried for 1 minute at 130° C. Thus, a release layer having a thickness of 2 μm was formed.

<Release Layer Forming Solution>

(a) Acrylamide copolymer (Tesfine 322, trade name, a product of Hitachi Kasei Polymer Co., Ltd.): 1.8 parts (b) Epoxy-melamine copolymer (SP-DRC No. 153N, trade name, a product of Dainippon Ink and Chemicals, Inc.): 41 parts (c) Paratoluenesulfonic acid (Dryer 900, trade name, a product of Hitachi Kasei Polymer Co., Ltd.): 0.2 parts

| (d) Solvent: | ethyl acetate | 46 parts |
| --- | --- | --- |
|  | methyl ethyl ketone | 11 parts |

(2) Preparation of Photographic Emulsion Surface Protective Layer in Uncured State:

On the release layer of the support prepared in (1), the following solution for forming a photographic emulsion surface protective layer in an uncured state was coated by means of a roll coater, and dried for 1 minute at 100° C. Thus, a 6 μm-thick uncured layer for protecting a photographic emulsion surface was formed.

<Solution for Forming Photographic Emulsion Surface Protective Layer>
(Ionized Radiation Curable Resin Composition)

A transfer sheet was prepared in the same manner as in Example 1, except that the solution for forming the photographic emulsion surface protective layer in an uncured state was replaced by the following solution. The curing index of the thus formed photographic emulsion surface protective layer in the uncured state was 150.

<Solution for Forming Photographic Emulsion Surface Protective Layer>
(Ionized Radiation Curable Resin Composition)

(3) Preparation of Transfer Sheet:

On the surface of this photographic emulsion surface protective layer in an uncured state, a 25 μm-thick PET film coated with silicone on one side was laminated as a separator to prepare a transfer sheet. The curing index of the photographic emulsion surface protective layer in an uncured state was 254.

(4) Preparation of Protective Layer-Covered Photomask:

The separator of the transfer sheet prepared in the foregoing manner was peeled away, and the transfer sheet and each of photomasks having as their substrates a plastic film and glass, respectively, were bonded together by means of a laminator. In both cases, the lamination was easily performed without becoming wrinkled. Each of these laminates was exposed from the PET film side by means of a high-pressure mercury lamp so that the integrated amount of exposure at 365 nm reached 450 mj/cm$^2$, and then the support was peeled away from the transfer sheet. Thus, a protective layer was formed on each of the photomasks.

The protective layer formed on each photomask had a hard surface, excellent resistance to scratches, and satisfactory adhesion to the emulsion surface. Further, it had excellent optical characteristics and high resistance to chemicals.

Example 2

A transfer sheet was prepared in the same manner as in Example 1, except that the solution for forming the photographic emulsion surface protective layer in an uncured state was replaced by the following solution. The curing index of the thus formed photographic emulsion surface protective layer in the uncured state was 150.

<Solution for Forming Photographic Emulsion Surface Protective Layer>
(Ionized Radiation Curable Resin Composition)

(a) Trifunctional acrylate (Aronix M-309, trade name, a product of Toagosei Chemical Industry Co., Ltd.): 12 parts (b) COOH group-containing monofunctional acrylate (Aronix M-5400, trade name, a product of Toagosei Chemical Industry Co., Ltd.): 9 parts (c) Polyamine (an acrylic graft copolymer, L-40M, trade name, a product of Soken Chemical & Engineering Co., Ltd.): 9 parts (d) Reaction initiator (Lucirin TPO, trade name, a product of BASF Japan Ltd.): 0.1 parts

| (e) Diluent: | ethyl acetate | 17.2 parts |
| --- | --- | --- |
|  | methyl ethyl ketone | 17.2 parts |
|  | ethyl cellosolve | 8.5 parts |

By the use of the transfer sheet thus obtained, protective layer-covered Photomasks were prepared in the same manner as in Example 1. The protective layer formed on each of the photomasks was excellent in surface hardness, close adhesion, optical characteristics and chemical resistance.

Example 3

A transfer sheet and protective layer-covered photomasks were prepared in the same manners as in Example 1, except that the solution for forming the photographic emulsion surface protective layer in an uncured state was replaced by the following solution. The curing index of the thus formed photographic emulsion surface protective layer in the uncured state was 130.

<Solution for Forming Photographic Emulsion Surface Protective Layer>
(Ionized Radiation Curable Resin Composition)

(a) Trifunctional acrylate (Aronix M-309, trade name, a product of Toagosei Chemical Industry Co., Ltd.): 9 parts (b) COOH group-containing monofunctional acrylate (Aronix M-5400, trade name, a product of Toagosei Chemical Industry Co., Ltd.): 12 parts (c) Polyamine (an acrylic comb copolymer, L-40M, trade name, a product of Soken Chemical & Engineering Co., Ltd.): 9 parts (d) Reaction initiator (Lucirin TPO, trade name, a product of BASF Japan Ltd.): 0.1 parts

| (e) Diluent: | ethyl acetate | 17.2 parts |
| --- | --- | --- |
|  | methyl ethyl ketone | 17.2 parts |
|  | ethyl cellosolve | 8.5 parts |

By the use of the transfer sheet thus obtained, protective layer-covered Photomasks were prepared in the same manner as in Example 1. The protective layer formed on each of the photomasks was excellent in surface hardness, close adhesion, optical characteristics and chemical resistance.

Example 4

A transfer sheet and protective layer-covered photomasks were prepared in the same manners as in Example 1, except that the solution for forming the photographic emulsion surface protective layer in an uncured state was replaced by the following solution. The curing index of the thus formed photographic emulsion surface protective layer in the uncured state was 140.

<Solution for Forming Photographic Emulsion Surface Protective Layer>
(Ionized Radiation Curable Resin Composition)

(a) Polyfunctional acrylate (Sanrad H-601, trade name, a product of Sanyo Chemical Industsries, Ltd.): 9 parts (b) COOH group-containing monofunctional acrylate (Aronix M-5400, trade name, a product of Toagosei Chemical Industry Co., Ltd.): 15 parts (c) Thermosetting resin (mixture of 3 parts of acrylpolyol, Thermolac 2000, trade name, a product of Soken Chemical & Engineering Co., Ltd., with 3 parts of polyisocyanate, Takenate D110N, trade name, a product of Takeda Chemical Industries, Ltd.)

(d) Reaction initiator (Lucirin TPO, trade name, a product of BASF Japan Ltd.): 0.1 parts

| (e) Diluent: | ethyl acetate | 26.4 parts |
| --- | --- | --- |
| | methyl ethyl ketone | 26.4 parts |
| | ethyl cellosolve | 13.1 parts |

By the use of the transfer sheet thus obtained, protective layer-covered Photomasks were prepared in the same manner as in Example 1. The protective layer formed on each of the photomasks was excellent in surface hardness, close adhesion, optical characteristics and chemical resistance.

Example 5

On the same support as used in Example 1, the cure layer forming solution described below was coated by means of a roll coater, dried for 1 minute at 100° C., and then exposed with a high-pressure mercury lamp so that the integrated amount of exposure (at 365 nm) reached 300 mj/cm². Thus, a cure layer having a thickness of about 1 μm was formed.

<Cure Layer Forming Solution>
(Ionized Radiation Curable Resin Composition)

(a) Polyfunctional acrylate (Sanrad H-601, trade name, a product of Sanyo Chemical Industries, Ltd.): 7 parts (b) COOH group-containing monofunctional acrylate (Aronix M-5400, trade name, a product of Toagosei Chemical Industry Co., Ltd.): 4 parts (c) Polyamine (acrylic comb polymer, L-40M, trade name, a product of Soken Chemical & Engineering Co., Ltd.): 4.5 parts (d) Reaction initiator (Lucirin TPO, trade name, a product of BASF Japan Ltd.): 0.1 parts

| (e) Diluent: | ethyl acetate | 28.4 parts |
| --- | --- | --- |
| | methyl ethyl ketone | 28.4 parts |
| | ethyl cellosolve | 14.1 parts |

On this cure layer, the following solution for forming a photographic emulsion surface protective layer was further coated by means of a roll coated, and dried for 1 minute at 100° C. Thus, a 6 μm-thick uncured layer for protecting a photographic emulsion surface was formed. And the curing index of the thus formed photographic emulsion surface protective layer in an uncured state was 194.

<Solution for Forming Photographic Emulsion Surface Protective Layer>
(Ionized Radiation Curable Resin Composition)

(a) Polyfunctional acrylate (Sanrad H-601, trade name, a product of Sanyo Chemicals Co., Ltd.): 8 parts (b) COOH group-containing monofunctional acrylate (Aronix M-5400, trade name, a product of Toagosei Chemical Industry Co., Ltd.): 13 parts (c) Polyamine (acrylic graft copolymer, L-40M, trade name, a product of Soken Chemical & Engineering Co., Ltd.): 9 parts (d) Reaction initiator (Lucirin TPO, trade name, a product of BASF Japan Ltd.): 0.1 parts

| (e) Diluent: | ethyl acetate | 17.2 parts |
| --- | --- | --- |
| | methyl ethyl ketone | 17.2 parts |
| | ethyl cellosolve | 8.5 parts |

Then, on the surface of this photographic emulsion surface protective layer in an uncured state, a 25 μm-thick PET film coated with silicone on one side was laminated as a separator to prepare a transfer sheet.

By the use of the thus prepared transfer sheet, protective layer-covered Photomasks were prepared in the same manner as in Example 1. The protective layer formed on each of the photomasks was excellent in surface hardness, close adhesion, optical characteristics and chemical resistance.

Example 6

A transfer sheet and protective layer-covered photomasks were prepared in the same manners as in Example 1, except that the solution for forming the photographic emulsion surface protective layer in an uncured state was replaced by the following solution. The curing index of the thus formed photographic emulsion surface protective layer in the uncured state was 282.

<Solution for Forming Photographic Emulsion Surface Protective Layer>
(Ionized Radiation Curable Resin Composition)

(a) Polyfunctional acrylate (Sanrad H-601, trade name, a UV-curable resin produced by Sanyo Chemical Industries, Ltd., wherein the monomer having an acryloyl group number of 5 and the monomer having an acryloyl group number of 6 are mixed in proportions of 4:6): 13.5 parts (b) COOH group-containing monofunctional acrylate (Aronix M-5400, trade name, a product of Toagosei Chemical Industry Co., Ltd.): 9 parts (c) Polyamine (an acrylic graft copolymer having an acrylic trunk chain and N-methylol acrylamide side chains, L-40M, trade name, a product of Soken Chemical & Engineering Co., Ltd.): 7.5 parts (d) Reaction initiator (Lucirin TPO, trade name, a product of BASF Japan Ltd.): 0.1 parts

| (e) Diluent: | ethyl acetate | 19 parts |
| --- | --- | --- |
| | methyl ethyl ketone | 19 parts |
| | ethyl cellosolve | 9.4 parts |

By the use of the transfer sheet thus obtained, protective layer-covered Photomasks were prepared in the same manner as in Example 1. The protective layer formed on each of the photomasks was excellent in surface hardness, close adhesion, optical characteristics and chemical resistance.

Example 7

A transfer sheet and protective layer-covered photomasks were prepared in the same manners as in Example 1, except that the solution for forming the photographic emulsion surface protective layer in an uncured state was replaced by the following solution. The curing index of the thus formed photographic emulsion surface protective layer in the uncured state was 226.

<Solution for Forming Photographic Emulsion Surface Protective Layer>

(Ionized Radiation Curable Resin Composition)

(a) Polyfunctional acrylate (Sanrad H-601, trade name, a UV-curable resin produced by Sanyo Chemical Industries, Ltd., wherein the monomer having an acryloyl group number of 5 and the monomer having an acryloyl group number of 6 are mixed in proportions of 4:6): 10.5 parts (b) COOH group-containing monofunctional acrylate (Aronix M-5400, trade name, a product of Toagosei Chemical Industry Co., Ltd.): 9 parts (c) Polyamine (an acrylic graft copolymer having an acrylic trunk chain and N-methylol acrylamide side chains, L-40M, trade name, a product of Soken Chemical & Engineering Co., Ltd.): 10.5 parts (d) Reaction initiator (Lucirin TPO, trade name, a product of BASF Japan Ltd.): 0.1 parts

| (e) Diluent: | ethyl acetate | 15.4 parts |
|---|---|---|
| | methyl ethyl ketone | 15.4 parts |
| | ethyl cellosolve | 7.6 parts |

By the use of the transfer sheet thus obtained, protective layer-covered Photomasks were prepared in the same manner as in Example 1. The protective layer formed on each of the photomasks was excellent in surface hardness, close adhesion, optical characteristics and chemical resistance.

Example 8

A transfer sheet and protective layer-covered photomasks were prepared in the same manners as in Example 1, except that the solution for forming the photographic emulsion surface protective layer in an uncured state was replaced by the following solution. The curing index of the thus formed photographic emulsion surface protective layer in the uncured state was 272.

<Solution for Forming Photographic Emulsion Surface Protective Layer>

(Ionized Radiation Curable Resin Composition)

(a) Bifunctional acrylate (NK-Ester APG-200, trade name, a product of Shin-Nakamura Chemical Co., Ltd.): 6 parts (b) COOH group-containing monofunctional acrylate (Aronix M-5400, trade name, a product of Toagosei Chemical Industry Co., Ltd.): 12 parts (c) Polyamine (an acrylic graft copolymer having an acrylic trunk chain and N-methylol acrylamide side chains, L-40M, trade name, a product of Soken Chemical & Engineering Co., Ltd.): 12 parts (d) Reaction initiator (Lucirin TPO, trade name, a product of BASF Japan Ltd.): 0.1 parts

| (e) Diluent: | ethyl acetate | 13.6 parts |
|---|---|---|
| | methyl ethyl ketone | 13.6 parts |
| | ethyl cellosolve | 6.7 parts |

By the use of the transfer sheet thus obtained, protective layer-covered Photomasks were prepared in the same manner as in Example 1. The protective layer formed on each of the photomasks was excellent in surface hardness, close adhesion and optical characteristics, and had practically sufficient chemical resistance.

Comparative Example 1

On one side of a 6 μm-thick transparent PET film, the following release layer forming solution was coated by means of a roll coater, dried for 3 minutes at 80° C., and further underwent aging treatment at 40° C. for 48 hours. Thus, a release layer having a thickness of about 1 μm was formed. Next the following adhesive layer forming solution was coated on the other side of the PET film by means of a roll coater, and dried for 2 minutes at 80° C., thereby forming an adhesive layer having a thickness of about 3 μm.

<Release Layer Forming Solution>

(a) Silicone-modified acrylic resin (SG-540SA, trade name, a product of Teikoku Chemical Industries Co., Ltd.): 3 parts (b) Acrylpolyol (Thermolac S2000, trade name, a product of Soken Chemical & Engineering Co., Ltd.): 17 parts (c) Isocyanate (Takenate D-110N, trade name, a product of Takeda Chemical Industries, Ltd.): 8 parts (d) Toluene: 36 parts
Methyl ethyl ketone: 36 parts <Adhesive Layer Forming Solution>

(a) Acrylpolyol (SK-dyne, trade name, a product of Soken Chemical & Engineering Co., Ltd.): 100 parts (b) Isocyanate (TD-75, trade name, a product of Soken Chemical & Engineering Co., Ltd.): 0.2 parts (c) Ethyl acetate: 2 parts On the surface of the adhesive layer thus formed, a 25 μm-thick PET film coated with silicone on one side was laminated as a separator to prepare a surface protective film.

The separator of the surface protective film prepared in the foregoing manner was peeled away, and the protective film was bonded to each of a film photomask and a glass photomask by means of a laminator. In this lamination process, the protective film was likely to have wrinkles and bad in workability. In addition, the protective film on each photomask, though it had satisfactory optical characteristics, had low resistance to scratches. Specifically, it had a pencil scratch value of B when measured on a glass plate.

Comparative Example 2

A transfer sheet was prepared in the same manner as in Example 1, except that the solution for forming the photographic emulsion surface protective layer in an uncured state was replaced by the following solution. The curing index of the thus formed photographic emulsion surface protective layer in the uncured state was 392.

<Solution for Forming Photographic Emulsion Surface Protective Layer>

(Ionized Radiation Curable Resin Composition)

(a) Polyfunctional acrylate (a UV-curable resin wherein the monomer having an acryloyl group number of 5 and the monomer having an acryloyl group number of 6 are mixed in proportions of 4:6, Sanrad H-601, trade name, a product of Sanyo Chemical Industries, Ltd.,): 21 parts (b) Polyamine (an acrylic graft copolymer, L-40M, trade name, a product of Soken Chemical & Engineering Co., Ltd.): 9 parts

| (c) Diluent: | ethyl acetate | 17.2 parts |
|---|---|---|
| | methyl ethyl ketone | 17.2 parts |
| | ethyl cellosolve | 8.5 parts |

By the use of the transfer sheet thus obtained, protective layer-covered Photomasks were prepared in the same manner as in Example 1. The protective layer formed on each photomask was very poor in adhesion to the photomask's emulsion surface.

Comparative Example 3

A transfer sheet was prepared in the same manner as in Example 1, except that the solution for forming the photographic emulsion surface protective layer in an uncured state was replaced by the following solution. The curing index of the thus formed photographic emulsion surface protective layer in the uncured state was 254.

<Solution for Forming Photographic Emulsion Surface Protective Layer>

(Ionized Radiation Curable Resin Composition)

(a) Polyfunctional acrylate (a UV-curable resin wherein the monomer having an acryloyl group number of 5 and the monomer having an acryloyl group number of 6 are mixed in proportions of 4:6, Sanrad H-601, trade name, a product of Sanyo Chemical Industries, Ltd.): 12 parts (b) Monofunctional acrylate (Aronix M-120, trade name, a product of Toagosei Chemical Industry Co., Ltd.): 9 parts (c) Polyamine (an acrylic graft copolymer having an acrylic trunk chain and N-methylol acrylamide side chains, L-40M, trade name, a product of Soken Chemical & Engineering Co., Ltd.): 9 parts (d) Reaction initiator (Lucirin TPO, trade name, a product of BASF Japan Ltd.): 0.1 parts

| (e) Diluent: | ethyl acetate | 17.2 parts |
|---|---|---|
| | methyl ethyl ketone | 17.2 parts |
| | ethyl cellosolve | 8.5 parts |

By the use of the transfer sheet thus obtained, protective layer-covered Photomasks were prepared in the same manner as in Example 1. The protective layer formed on each photomask was poor in adhesion to the photomask's emulsion surface.

The results obtained in Examples and Comparative Examples are summarized in Tables 1 and 2.

TABLE 1

| | Protective Layer in Uncured State | |
|---|---|---|
| | Polyfunctional monomer/ monofunctional monomer/thermosetting resin (or polyamine) | Curing Index |
| Example 1 | 40/30/30 | 254 |
| Example 2 | 40/30/30 | 150 |
| Example 3 | 30/40/30 | 130 |
| Example 4 | 30/50/20 | 218 |
| Example 5 | 27/43/30 | 194 |
| Example 6 | 45/30/25 | 282 |
| Example 7 | 35/30/35 | 226 |
| Example 8 | 40/30/30 | 254 |
| Comparative Example 1 | — | — |
| Comparative Example 2 | 70/0/30 | 392 |
| Comparative Example 3 | 40/30 (free of hydrophilic group)/30 | 254 |

TABLE 2

| | Pencil hardness | Close Adhesion (%) | Transmittance (%) | Chemical resistance (times) |
|---|---|---|---|---|
| Example 1 | 2H | 100 | 88 | >100 |
| Example 2 | 2H | 100 | 88 | >100 |
| Example 3 | 2H | 100 | 87 | >100 |
| Example 4 | H | 85 | 87 | >100 |
| Example 5 | 2H | 100 | 87 | >100 |
| Example 6 | 2H | 100 | 87 | >100 |
| Example 7 | 2H | 100 | 87 | >100 |
| Example 8 | H | 100 | 87 | 50 |
| Comparative Example 1 | B | 100 | 85 | >100 |
| Comparative Example 2 | HB | 0 | 88 | >100 |
| Comparative Example 3 | HB | 0 | 87 | >100 |

(Evaluation Methods)

Pencil Hardness: A protective layer-covered photomask was placed on a glass plate, and the hardness of the cured layer thereof was evaluated by a pencil scratch test (according to JIS K 5400). And the pencil scratch value was determined.

Close adhesion: Close adhesion between the emulsion surface and a protective layer was evaluated by a crosshatch test (according to JIS K 5400).

Transmittance: A cured layer and a protective film were formed on a blue sheet glass (2 mm in thickness), and examined for transmittance at 365 nm by means of a spectrophotometer (Hitachi Spectrophotometer U-3310), wherein the blue sheet glass in itself had the transmittance of 89% at 365 nm.

Chemical Resistance: Chemical resistance of a protective layer was evaluated by a rubbing test using a cloth moistened with methanol.

<Examples Concerning Proximity Exposure>

Example 9

A transfer sheet was prepared in the same manner as in Example 1, except that the surface of the PET film used as the support was processed so as to have a ten-point mean roughness of 0.48 μm. The emulsion surface protective layer of the transfer sheet thus prepared was transferred to a photomask having a glass substrate, thereby making a protective layer-covered photomask.

Example 10

A transfer sheet was prepared in the same manner as in Example 1, except that the surface of the PET film used as the support was processed so as to have a ten-point mean roughness of 0.24 μm. The emulsion surface protective layer of the transfer sheet thus prepared was transferred to a photomask having a glass substrate, thereby making a protective layer-covered photomask.

(Patterning of Dry Film)

A 40 μm-thick photosensitive coating of a dry film (VANX F-340, trade name, a product of Fuji Film Olin Corp.) was transferred to a blue sheet glass having a thickness of 2 mm by using a laminator VA700 (made by Taisei Laminator Co., Ltd.) under conditions that the roll temperature was 100° C., the transfer pressure was 0.3 Mpa and the transfer speed was 1 m/min.

Via each of the protective layer-covered, glass substrate-type photomasks prepared in Examples 1, 9 and 10, the photosensitive coating was subjected to proximity exposure (exposure under a condition that a slight distance was kept between the photomask and the subject). In this exposure process, a 500 W ultrahigh-pressure mercury lamp (made by Ushio Inc.) was used as light source and the integrated amount of exposure at 365 nm was adjusted to 40 mj/cm$^2$. And the photomask used therein had patterns in 25 μm width. After the exposure, each photosensitive coating underwent alkali spray development, and thereby patterns were produced therein. The surface roughness (Rz) measurements of the plastic films were made with a three-dimensional surface roughness analyzer, Surfcoader SE-30K (made by Kosaka Laboratory Ltd.).

The evaluation of the patterns obtained are shown in Table 3.

TABLE 3

| Example | Surface roughness of support (PET film) (Rz: 10-point mean roughness with respect to the reference length of 0.3 mm) | Reproducibility of patterns in dry film |
| --- | --- | --- |
| Example 1 | $0.9 \times 10^{-2}$ μm | excellent |
| Example 9 | $1.4 \times 10^{-2}$ μm | good |
| Example 10 | $5.6 \times 10^{-2}$ μm | poor (the patterns produced had uneven surface) |

When the PET films having excellent surface smoothness were used as the support, the emulsion surface protective layers transferred on photomasks had good surface properties and ensured reproduction of good patterns even in the case of proximity exposure. On the other hand, when the PET film inferior in surface smoothness (the Rz value of which was greater than $5.0 \times 10^{-2}$ μm) was used as the support, asperities in the shape of crater were formed at the surface of the dry film-originated photosensitive coating after development to result in poor reproducibility of patterns. As a cause of this result, it is supposed that, when the support surface was rough, the surface of the emulsion surface protective layer transferred on the photomask was roughened and the refraction of ultraviolet rays occurred upon exposure to produce a bad influence on patterning of the photosensitive coating.

Industrial Applicability

The present transfer sheet enables easy transfer without applying heat or a solvent to a subject because, at time of transferring to a subject surface, tentative bonding is performed first with the aid of adhesion of the adhesive layer and then complete bonding is effected by irradiation with ionized radiation. Further, as the adhesive layer contains both a monofunctional (meth)acrylate and a low-viscosity ionized radiation curable resin made up of polyfunctional (meth)acrylate units, the protective layer formed can have excellent scratch resistance, close adhesion to an emulsion surface and high chemical resistance. Therefore, the present transfer sheet is effective especially in forming a protective layer for protection of the emulsion surface of a photomask.

Moreover, the present protective layer-covered photomask obtained by using the present transfer sheet can be used consistently for a long time because the photomask is provided with the protective layer excellent in not only optical characteristics but also scratch resistance and close adhesion.

What is claimed is:

1. A photographic emulsion surface protective layer transfer sheet, which comprises: a support having at least one surface with releasability and, on the side of the support having that surface, a photographic emulsion surface protective layer which is adhesive and in an uncured state, wherein the photographic emulsion surface protective layer in an uncured state comprises an ionized radiation-curable resin composition containing a hydrophilic group-containing monofunctional (meth)acrylate and a polyfunctional (meth)acrylate.

2. A photographic emulsion surface protective layer transfer sheet as described in claim 1, wherein the photographic emulsion surface protective layer in an uncured state further comprises a thermosetting resin, an wherein the ionized radiation curable resin composition contains, as main components, a hydrophilic group-containing monofunctional (meth)acrylate and a polyfunctional (meth)acrylate having an acryloyl group number of at least 3.

3. A photographic emulsion surface protective layer transfer sheet as described in claim 1, wherein the photographic emulsion surface protective layer in an uncured state further contains at least one polyamine selected from polyamines containing primary or secondary amino groups.

4. A photographic emulsion surface protective layer transfer sheet as described in claim 2, wherein the ionized radiation curable resin composition is contained in a proportion of from 60 weight % to 85 weight % in the photographic emulsion surface protective layer in an uncured state.

5. A photographic emulsion surface protective layer transfer sheet as described in claim 1, wherein the hydrophilic group-containing monofunctional (meth)acrylate is contained in a proportion of from 20 weight % to 55 weight % in the photographic emulsion surface protective layer in an uncured state.

6. A photographic emulsion surface protective layer transfer sheet as described in claim 1, wherein the hydrophilic group-containing monofunctional (meth)acrylate is a monofunctional (meth)acrylate containing at least one carboxyl group.

7. A photographic emulsion surface protective layer transfer sheet which comprises: a support having at least one surface with releasability and, on the side of the support having that surface, a photographic emulsion surface protective layer which is adhesive and in an uncured state, wherein the photographic emulsion surface protective layer in an uncured state comprises an ionized radiation-curable resin composition containing a hydrophilic group-containing monofunctional (meth)acrylate and a polyfunctional (meth)acrylate, and wherein the photographic emulsion surface protective layer in an uncured state has a curing index (I) represented by the following equation in the range of 80 to 300:

$$I = R1 \times S1 + R2 \times S2 + \ldots + Rn \times Sn$$

wherein I is a curing index; R1, R2, ..., Rn are percentages by weight of resin components (resin 1, resin 2, ..., resin n), respectively, in the photographic emulsion surface protective layer in an uncured state; and S1, S2, ..., Sn are acryloyl group numbers of resin components (resin 1, resin 2, ..., resin n), respectively, in the photographic emulsion surface protective layer in an uncured state.

8. A photographic emulsion surface protective layer transfer sheet as described in claim 1, further having at least one cure layer between the support surface and the photographic emulsion surface protective layer in an uncured state.

9. A photographic emulsion surface protective layer transfer sheet as described in claim 1, wherein the support has a surface roughness of $5.0 \times 10^{-2}$ μm or below in terms of ten-point mean roughness with respect to a reference length of 0.8 mm as defined in JIS-B-0601.

10. A method of forming a photographic emulsion surface protective layer, comprising (1) bonding a photographic emulsion surface protective layer transfer sheet as described in claim 1 to an emulsion surface so that the photographic emulsion surface protective layer in uncured state is brought into contact with the emulsion surface, (2) curing the photographic emulsion surface protective layer in an uncured state by irradiation with ionized radiation from the support side and, at the same time, making the photographic emulsion surface protective layer adhere to the emulsion surface, and (3) peeling off the support of the transfer sheet and leaving the emulsion protective layer alone on the emulsion surface.

11. A protective layer-covered photomask, which comprises a photomask and, thereon, a photographic emulsion surface protective layer formed by use of a method as described in claim 10.

12. A protective layer-covered photomask as described in claim 11, wherein the photographic emulsion surface protective layer has a pencil hardness of at least H as measured in accordance with the pencil scratch test defined in JIS K-5400.

13. A photographic emulsion surface protective layer transfer sheet as described in claim 1, wherein the support is a plastic film containing, as a main component, polyethylene terephthalate, polypropylene, polyvinyl chloride, polystyrene, polycarbonate, or triacetate.

14. A photographic emulsion surface protective layer transfer sheet as described in claim 1, wherein the support has a thickness of from about 20 μm to about 150 μm.

15. A photographic emulsion surface protective layer transfer sheet as described in claim 1, wherein the support has a layer of release agent on the surface contacting the photographic emulsion surface protective layer.

16. A photographic emulsion surface protective layer transfer sheet as described in claim 15, wherein the release agent is a coating of silicone, teflon, urethane resin, melamine resin, fluorocarbon resin, silicone resin, polyester resin, polyolefin resin or a mixture thereof having a dry thickness of 0.1 to 5 μm.

17. A photographic emulsion surface protective layer transfer sheet as described in claim 1, wherein the support has an ionized-radiation transmittance of at least 50%.

18. A photographic emulsion surface protective layer transfer sheet as described in claim 1, which further comprises, on the side of the photographic emulsion surface protective layer opposite the support, a separator layer which is a film of a plastic or a paper coated with a release agent.

19. The method of claim 10, wherein the bonding and curing of the photographic emulsion surface protective layer is conducted without heating or application of a solvent.

20. A photographic emulsion surface protective layer transfer sheet as described in claim 8, wherein the cure layer is a cured resin from a composition comprising a hydrophilic group-containing monofunctional (meth)acrylate and a polyfunctional (meth)acrylate.

* * * * *